United States Patent [19]
Steinberg et al.

[11] Patent Number: 5,298,103
[45] Date of Patent: Mar. 29, 1994

[54] ELECTRODE ASSEMBLY USEFUL IN CONFINED PLASMA ASSISTED CHEMICAL ETCHING

[75] Inventors: George N. Steinberg, Westport; Charles B. Zarowin, Rowayton, both of Conn.

[73] Assignee: Hughes Aircraft Company, Los Angeles, Calif.

[21] Appl. No.: 93,120

[22] Filed: Jul. 15, 1993

[51] Int. Cl.$^5$ .............. B44C 1/22; H01L 21/306
[52] U.S. Cl. .................... 156/345; 156/643
[58] Field of Search ........... 156/345, 643, 646, 657, 156/662; 204/298.31, 298.33, 298.34; 118/723 E, 723 ER, 723 I; 219/121.4, 121.41

[56] References Cited

U.S. PATENT DOCUMENTS 5,006,220  4/1991  Hijikata et al. ............ 156/345 X
5,009,738  4/1991  Gruenwald et al. ......... 156/345

Primary Examiner—William Powell
Attorney, Agent, or Firm—M. E. Lachman; M. W. Sales; W. K. Denson-Low

[57] ABSTRACT

An electrode assembly (10) for use in confined plasma assisted chemical etching includes an electrode (16) having a D.C. voltage source (46) connected thereto in addition to a source (60) of R. F. voltage such that ions formed during during plasma etching process are slowed or repelled from the electrode (16) as well as from a surrounding plasma confining member (18).

13 Claims, 2 Drawing Sheets

ELECTRODE ASSEMBLY USEFUL IN CONFINED PLASMA ASSISTED CHEMICAL ETCHING

BACKGROUND OF THE INVENTION

The present invention generally relates to an electrode assembly useful in confined plasma assisted chemical etching and, in particular, relates to one such electrode assembly having means for providing a D.C. bias voltage to the electrode.

As used herein the phrase "confined plasma" is taken to means a plasma discharge that is laterally bounded such that the spatial footprint of the plasma can be controlled.

A general theory of the physical factors involved in the plasma assisted chemical etching process is provided in the article entitled *A Theory of Plasma-Assisted Chemical Vapor Transport Processes*; by C. B. Zarowin in the Journal of Applied Physics, 57(3), Feb. 1, 1985. Therein a set of mathematical equations are developed that describe the factors involved in the flow of the plasma. Among other factors discussed therein is the effect of the external application of, or self-induced, dc bias are discussed as having effects similar to that of temperature differences in that both superpose algebraically in the transport rate.

Recently, the use of plasma assisted chemical etching has been applied to both the thinning and flattening of semiconductor wafers. In such applications a confined plasma is established between a relatively small area electrode, or puck, and a larger electrode. The semiconductor wafer is disposed between the puck and the larger electrode and is the thinned or flattened by creating relative motion between the semiconductor wafer and the puck in accordance with a predetermined dwell time map. In order to achieve a highly accurate process, the plasma discharge is confined so that the operating plasma etching footprint is smaller than the smallest surface variation to be etched.

As well known in the semiconductor wafer processing art, it is extremely important at each step of the semiconductor wafer processing to avoid the contamination of the semiconductor wafer surface. A typical semiconductor industry surface cleanliness specification is less than 2 particles greater than 0.1 micrometer in diameter over the entire surface of a wafer. Hence, considerable time and expense are used to ensure that the surface of the semiconductor wafer is as free of particulates as possible.

Presently, electrode assemblies include an electrode formed from a porous electrically conductive material and disposed at one end of an electrode holder. An electrically insulating chimney is disposed such that the electrode extends partially through a clearance opening in the chimney. The porous conductive material allows the flow of an etchant gas through the electrode to sustain the plasma. The surrounding chimney helps to ensure the desired lateral confinement of the plasma discharge. In operation, it has been found that both the puck electrode and the chimney are subject to a relatively high rate of erosion. The erosion is primarily caused by high energy ions impinging upon the electrode and chimney. Further, because the opening in the chimney is a clearance opening, there is a gap between the electrode and the walls of the chimney opening. This gap can result in the sputtering of the electrode thereby creating a source of contamination.

Further, the erosion of the puck electrode and the surrounding chimney not only greatly reduces the operating life of those components but also serves as a source of contamination of the semiconductor wafer surface.

Hence, it is highly desirable to provide an electrode assembly that has a comparatively longer life and which reduces the in-process contamination of the semiconductor wafer surface.

SUMMARY OF THE INVENTION

Accordingly, it is one object of the present invention to provide an electrode assembly that substantially completely overcomes the above-recited drawbacks of conventional electrode assemblies.

This object is accomplished, at least in part, by an electrode assembly having means for providing a D.C. bias voltage to the electrode.

Other objects and advantages of the present invention will become apparent to those skilled in the art from the following detailed description read in conjunction with the appended claims and the drawings attached hereto.

BRIEF DESCRIPTION OF THE DRAWINGS

The drawings, not drawn to scale, include.

DETAILED DESCRIPTION OF THE INVENTION

Figure 1:
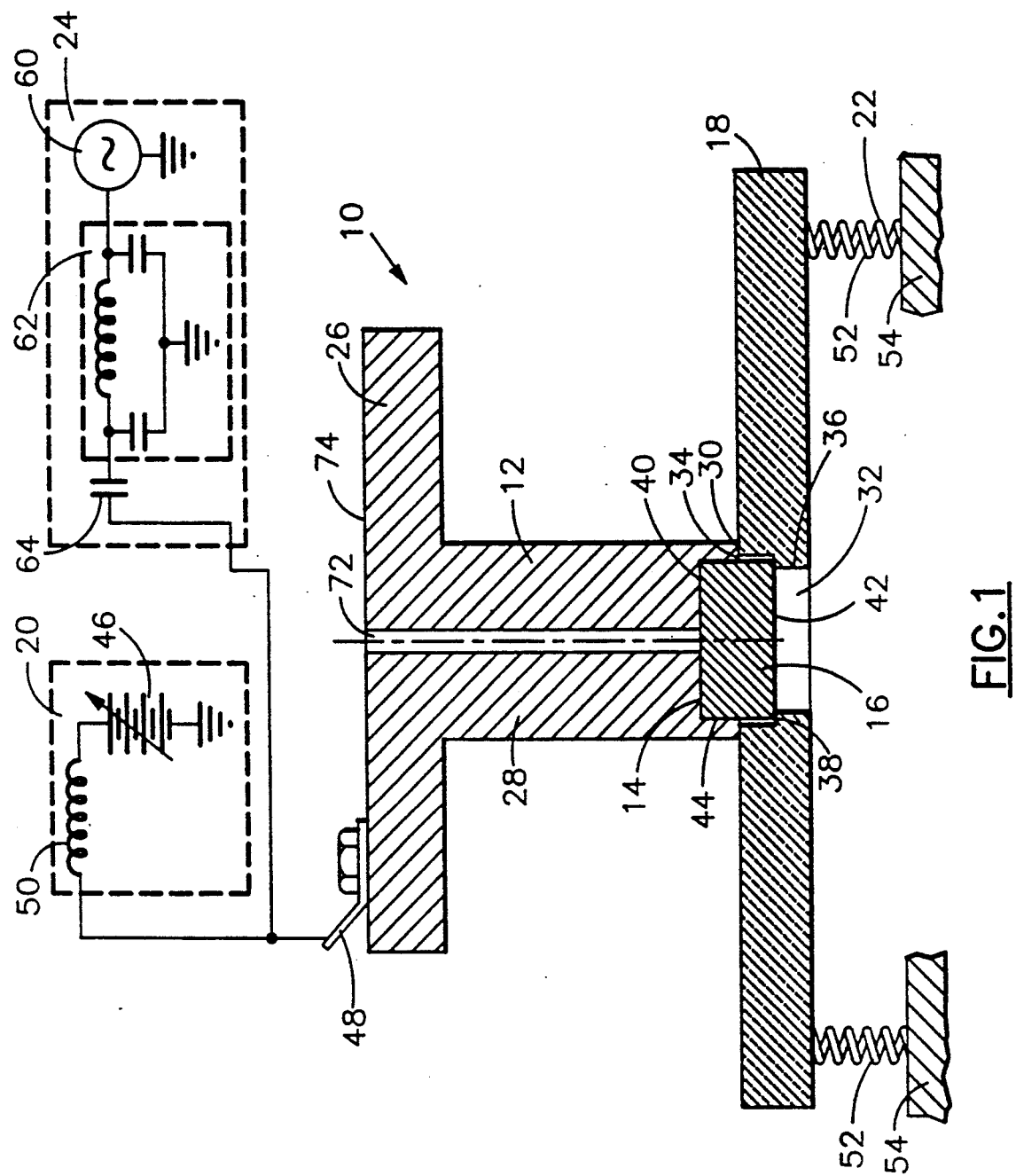
FIG. 1 which is a cross-sectional view of an electrode assembly embodying the principles of the present invention.

Although the theory and effects of applying a d.c. bias voltage to affect the vapor transport processes of a plasma, have been discussed in the general literature, for example, see the above-referenced article entitled *A Theory of Plasma-Assisted Chemical Vapor Transport Processes*, by C. B. Zarowin, in the Journal of Applied Physics, 57 (3), Feb. 1, 1985, no specific structure, particularly for a confined plasma, was discussed therein. The structure of the present invention described hereinafter is nonetheless generally related to the above-discussed theory. An electrode assembly, generally indicated at 10 in the Figures and embodying the principles of the present invention, includes an electrode holder 12 having means 14 for receiving an electrode 16, means 18 for laterally confining a plasma formed at the electrode 16 and means 20 for providing a D.C. bias voltage to the electrode 16. Preferably, the electrode assembly 10 further includes means 22 for urging the plasma confining means 18 against the electrode 16 and means 24 for providing an R.F. voltage to the electrode 16.

In the preferred embodiment, the electrode holder 12 includes a mounting flange 26 having a pedestal member 28 extending therefrom. The pedestal member 28, at an end 30 thereof distal the mounting flange 26, includes the means 14 for receiving the electrode 16. Preferably, the means 14 for receiving the electrode 16 is a cavity extending into the end 30 of the pedestal member 28.

The means 18 for laterally confining a plasma is, in this embodiment, an electrically insulating member having an opening 32 therethrough. As shown, in the preferred embodiment, in FIG. 1, the opening 32 includes a comparatively larger diameter section 34 proximate the electrode 16 and a comparatively smaller diameter section 36 distal the electrode 16 whereby an electrode seat 38 is formed at the interface of the sections, 34 and 36. Alternatively, the means 18 for laterally confining a plasma could have an opening 32 that has a uniform diameter therethrough which uniform diameter would preferably be smaller that the diameter of the electrode 16.

In the preferred embodiment, the pedestal member 28 is cylindrical and the cavity has a circular cross-section. In such an embodiment, the electrode 16 is a cylindrical member of porous electrically conductive material having first and second opposing surfaces, 40 and 42, respectively, and a sidewall 44. Further, the inside diameter of the cavity and the outside diameter of the electrode 16 are cooperatively dimensioned such that the electrode 16 frictionally fits into the cavity. Preferably, the depth of the cavity is chosen so that about half of the electrode 16 extends therefrom.

In this particular embodiment, the comparatively larger diameter section 34 of the opening 32 has a diameter that is larger than the electrode 16 and a depth that is slightly less than the length of the sidewall 44 of the electrode 16 extending beyond the one end 30 of the pedestal member 28. The comparatively smaller diameter section 36 of the opening 32 has a diameter that is less than the diameter of the electrode 16. Hence, when the means 18 for laterally confining the plasma is urged against the electrode 16 the electrode seat 38 abuts one of the surfaces, for example, surface 42, of the electrode 16 such that there are no lateral gaps accessible to a plasma established at the surface 42 of the electrode 16.

As shown in FIG. 1, the means 20 for providing a D.C. bias voltage to the electrode 16 includes a D.C. voltage source 46 electrically connected to the electrode 16 via a connector 48 affixed to the mounting flange 26 of the electrode holder 12. Preferably, the D.C. voltage source 46 is a variable D.C. voltage source such that the D.C. bias voltage applied to the electrode 16 can be regulated and adjusted to the plasma operating conditions. As shown, the means 20 also includes an R.F. isolation coil 50 serially disposed between the D.C. voltage source 46 and the connector 48.

The electrode assembly 10 is, preferably, further provided with means 22 for urging the means 18 for laterally confining the plasma against the electrode 16. In the embodiment shown, the urging means 22 includes a plurality of springs 52 disposed between the means 18 for confining the plasma and a stationary structure 54. In the embodiment shown in FIG. 2, wherein the electrode 16 extends into a vacuum chamber 56, the stationary structure 54 can be implemented by means of a plurality of shelves 58, each shelf 58 extending into the vacuum chamber 56 and each having a spring 52 associated therewith extending between the shelf 58 and the means 18 for confining the plasma such that the means 18 is urged toward the electrode 16. Alternatively, the stationary structure 54 can be formed as a single continuous shelf 58 extending about the inside periphery of the vacuum chamber 56.

In the embodiment shown, the means 24 for supplying an R.F. voltage to the electrode 16 includes an R.F. source 60 connected to the electrical connector 48 via an R.F. impedance matching circuit 62. In one preferred embodiment, the R.F. matching circuit 62 matches the output impedance of the R.F. source 60 to the R.F. impedance of the electrode 16 to reduce reflected R.F. energy. Preferably, the R.F. impedance matching circuit 62 is isolated from the D.C. voltage source 46, also affixed to the connector 48 by means of a D.C. blocking capacitor 64 disposed between the output of the impedance matching circuit 62 and the electrical connector 48 on the mounting flange 26 of the electrode holder 12.

In one specific embodiment, the electrode 16 is a cylindrical disc of porous silicon carbide having an outside diameter of about one inch of thickness of about one half inch. Preferably, the means 18 for laterally confining a plasma is formed from fused silica. In this embodiment, the comparatively larger section 34 of the opening 32 has a diameter of about 1.01 inches and the comparatively smaller section 36 of the opening 32 has a diameter of about 0.75 inch. Typically, pedestal member 28 of the electrode holder 12 has an outside diameter of about 1.25 inches.

Figure 2:
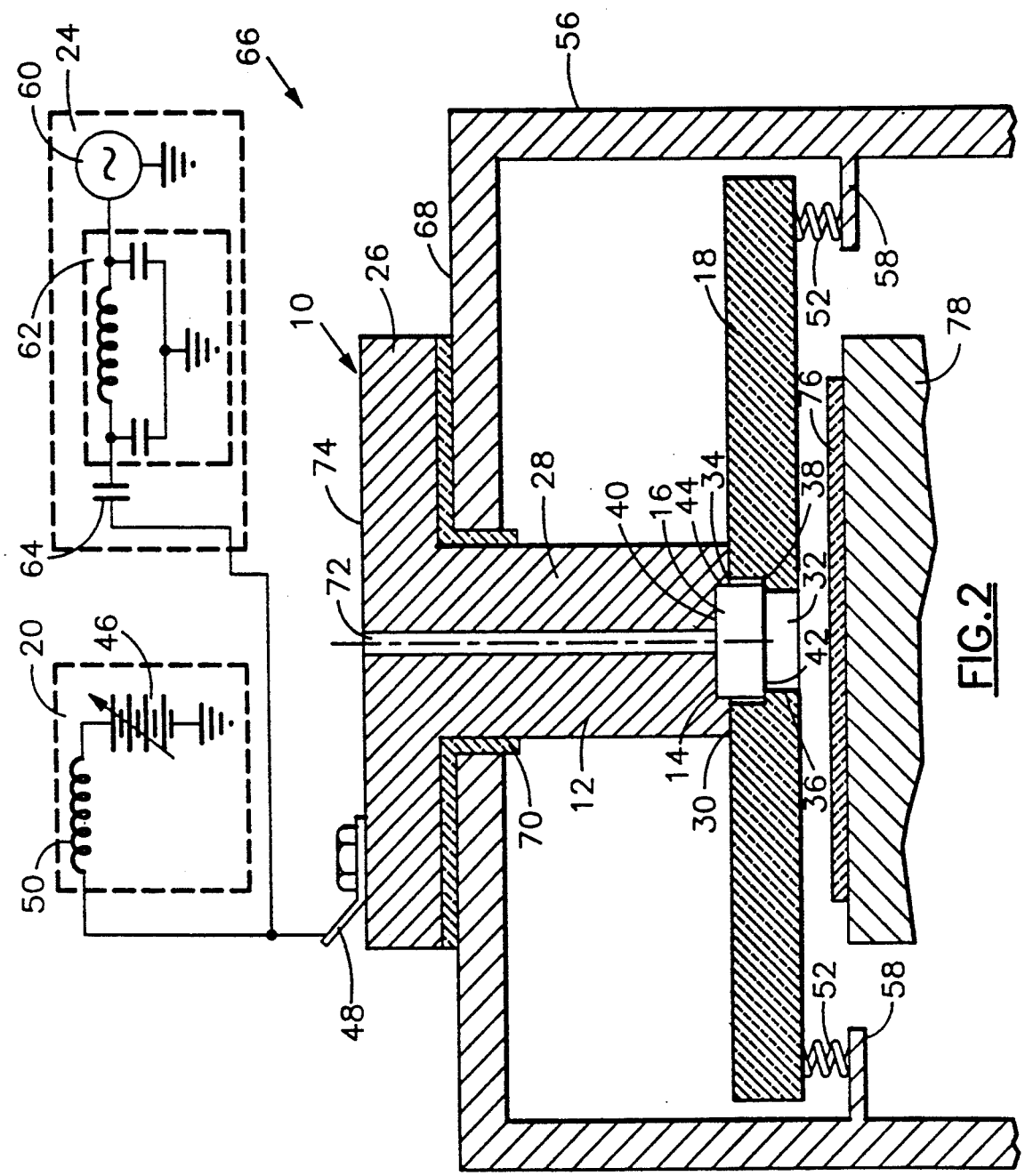
FIG. 2 which is a schematic of a system employing the electrode assembly of the present invention.

In one exemplary configuration of a system, generally indicated at 66 in FIG. 2 and embodying the principles of the present invention, the electrode holder 12 is mounted, via the mounting flange 26, to a wall 68 of the vacuum chamber 56 such that the pedestal member 28 extends through a wall 68 and into the vacuum chamber 56 wherein the plasma processing occurs. The electrode holder 12 can be secured to the wall 68 of the vacuum chamber 56 by conventional mounting techniques. The mounting flange 26 is electrically insulated from the wall 68 of the chamber 56 by, for example, a bushing, or annular plate, 70 of electrically insulating material such as, fused silica, glass-ceramic, ceramic, or the like. In addition, in the preferred embodiment, electrode holder 12 is provided with a plasma gas passage 72 extending from the outside surface 74 of the mounting flange 26 to the cavity in the pedestal holder 28. In the preferred embodiment, the plasma gas passage 72 is coaxial with the cavity, and hence, the electrode 16. Such an arrangement serves to ensure the substantially uniform distribution of the reaction gas through the porous electrode 16. In the embodiment shown, in operation, a semiconductor wafer 76 is disposed upon a platen 78 that provides relative motion between the electrode 16 and the surface of the semiconductor wafer 76 such that the entire semiconductor wafer surface can be selectively exposed to the plasma. Typically, the platen 78 is formed from an electrically conductive material and serves as a second electrode for the establishment of a confined plasma. It will be understood that FIG. 2 is not drawn to scale to enable the details of the electrode assembly 10 to be clearly shown.

Although the electrode assembly has been described and discussed herein with respect to one or more embodiments it will be understood by those skilled in the art that other arrangements and configuration can also be implemented that do not exceed the spirit and scope of the present invention. Hence, the present invention is deemed limited only by the appended claims and the reasonable interpretation thereof.

What is claimed is:

1. An electrode assembly useful in confined plasma assisted chemical etching; comprises:
   an electrode holder, said electrode holder having means for receiving an electrode;
   means for laterally confining a plasma discharge established at said electrode; and
   means for establishing a D.C. bias voltage on said electrode.

2. The assembly as claimed in claim 1, further comprising:
   means for urging said means for laterally confining a plasma discharge against said electrode.

3. The assembly as claimed in claim 1 further commprising:

means for providing an R.F. voltage to said electrode.

4. The assembly as claimed in claim 1 wherein said electrode holder includes a flange, said flange being disposed distal said end.

5. The assembly as claimed in claim 1 wherein said means for establishing a D.C. bias voltage incudes a variable D.C. voltage source electrically connected to said electrode.

6. The assembly as claimed in claim 5 wherein said assembly further includes means for providing an R.F. voltage to said electrode.

7. The assembly as claimed in claim 6 wherein said means for establishing a D.C. bias voltage further includes means for electrically isolating said variable D.C. voltage source from said means for providing an R.F. voltage to said electrode.

8. The assembly as claimed in claim 3 further comprising means for matching the impedance of said means for providing an R.F. voltage to the inpedance of said electrode.

9. The assembly as claimed in claim 8 wherein said means for providing an R.F. voltage to said electrode includes means for electrically isolating said impedance matching means from said D.C. voltage source.

10. The assembly as claimed in claim 1, wherein said means for receiving an electrode is a cavity extending into said end of said electrode holder, said electrode being disposed in said cavity.

11. The assembly as claimed in claim 10 wherein said electrode extends from said cavity.

12. The assembly as claimed in claim 11 wherein said means for confining a plasma includes an opening therein, said opening having a comparatively larger diameter section proximate said electrode and a comparatively smaller diameter section distal said electrode whereby an electrode seat is established the interface of the sections of the opening.

13. The assembly as claimed in claim 12 wherein said electrode is a cylindrical disk having a diameter and the comparatively smaller diameter section has a diameter smaller than said diameter of said electrode.

* * * * *